US012687875B2

(12) United States Patent
Liu et al.

(10) Patent No.: US 12,687,875 B2
(45) Date of Patent: Jul. 21, 2026

(54) BIAS CIRCUIT AND AMPLIFIER

(71) Applicant: SMARTER MICROELECTRONICS (GUANG ZHOU) CO., LTD., Guangzhou (CN)

(72) Inventors: Chifeng Liu, Guangzhou (CN); Qiang Su, Guangzhou (CN); Xiao Xu, Guangzhou (CN); Yongle Li, Guangzhou (CN)

(73) Assignee: SMARTER MICROELECTRONICS (GUANG ZHOU) CO., LTD., Gangzhou (CN)

( * ) Notice: Subject to any disclaimer, the term of this patent is extended or adjusted under 35 U.S.C. 154(b) by 685 days.

(21) Appl. No.: 17/929,705

(22) Filed: Sep. 4, 2022

(65) Prior Publication Data

US 2022/0413538 A1 Dec. 29, 2022

Related U.S. Application Data

(63) Continuation of application No. PCT/CN2021/130749, filed on Nov. 15, 2021.

(30) Foreign Application Priority Data

Feb. 26, 2021 (CN) .......................... 202110219250.4

(51) Int. Cl.
*G05F 3/26* (2006.01)
*H03F 1/02* (2006.01)
(Continued)

(52) U.S. Cl.
CPC .............. *G05F 3/262* (2013.01); *H03F 1/02* (2013.01); *H03F 1/30* (2013.01); *H03F 3/04* (2013.01); *H03F 3/21* (2013.01); *H03M 1/66* (2013.01)

(58) Field of Classification Search
CPC ... G05F 3/262; H03F 1/02; H03F 1/30; H03F 3/04; H03F 3/21; H03F 1/301;
(Continued)

(56) References Cited

U.S. PATENT DOCUMENTS

| | | | |
|---|---|---|---|
| 2016/0061658 A1* | 3/2016 | Sugizaki | H03F 1/086 250/206 |
| 2017/0235423 A1* | 8/2017 | Hwang | G05F 3/262 345/174 |
| 2023/0396260 A1* | 12/2023 | Dempsey | H03F 3/3027 |

FOREIGN PATENT DOCUMENTS

| | | |
|---|---|---|
| CN | 202794314 U | 3/2013 |
| CN | 106817093 A | 6/2017 |
| CN | 113037222 A | 6/2021 |

OTHER PUBLICATIONS

China International Search Report and written opinion in Application No. PCT/CN2021/130749, mailed on Jan. 28, 2022.
(Continued)

*Primary Examiner* — Andrea Lindgren Baltzell
*Assistant Examiner* — Jose E Pinero
(74) *Attorney, Agent, or Firm* — Syncoda LLC; Feng Ma

(57) ABSTRACT

A bias circuit includes a mirror current source and a current-to-voltage converter. A first terminal of the mirror current source is connected to a supply voltage terminal, a second terminal of the mirror current source is connected to a reference voltage terminal, and a third terminal of the mirror current source is connected to the current-to-voltage converter. A mirror current source is configured to acquire a supply voltage transmitted at the supply voltage terminal through the first terminal, acquire a reference voltage transmitted at the reference voltage terminal through the second terminal, and regulate the supply voltage by using the reference voltage and a preset parameter to obtain a mirror current corresponding to the supply voltage. The preset
(Continued)

parameter is parameter information of the mirror current source. The current-to-voltage converter is configured to convert the mirror current into a voltage to provide a bias voltage based on the voltage.

12 Claims, 10 Drawing Sheets

(51) Int. Cl.

| | | |
|---|---|---|
| *H03F 1/30* | (2006.01) | |
| *H03F 3/04* | (2006.01) | |
| *H03F 3/21* | (2006.01) | |
| *H03M 1/66* | (2006.01) | |

(58) Field of Classification Search
CPC ........... H03F 2200/451; H03F 2200/61; H03F 1/223; H03F 3/193; H03F 3/245; H03F 3/20; H03M 1/66
USPC ......................................................... 330/296
See application file for complete search history.

(56) References Cited

OTHER PUBLICATIONS

China first office action in Application No. 202110219250.4, mailed on Aug. 15, 2022.

* cited by examiner

BIAS CIRCUIT AND AMPLIFIER

CROSS-REFERENCE TO RELATED APPLICATIONS

This is a continuation of International Application No. PCT/CN2021/130749 filed on Nov. 15, 2021, which claims priority to Chinese Patent Application No. 202110219250.4 filed on Feb. 26, 2021. The disclosures of the above-referenced applications are hereby incorporated by reference in their entirety.

BACKGROUND

When the amplifier operates in a high linear mode (4 Generation (4G) Long Term Evolution (LTE) or 5G New Radio (NR)), a gain of the amplifier needs to remain unchanged as possible as the input power increases. In a case where a gain of the amplifier varies small, the output power varies linearly with the increase or decrease of the input power, so that the amplifier has a high linearity.

SUMMARY

The present disclosure relates to the technical field of circuitry, and more particularly to a bias circuit and an amplifier.

Various embodiments of the present disclosure provide a bias circuit and an amplifier, to improve accuracy of a bias voltage provided.

An embodiment of the present disclosure provides a bias circuit, which includes a mirror current source and a current-to-voltage converter.

A first terminal of the mirror current source is connected to a supply voltage terminal.

A second terminal of the mirror current source is connected to a reference voltage terminal.

A third terminal of the mirror current source is connected to the current-to-voltage converter.

The mirror current source is configured to: acquire, through the first terminal, a supply voltage transmitted by the supply voltage terminal; acquire, through the second terminal, a reference voltage transmitted by the reference voltage terminal; and regulate the supply voltage by using the reference voltage and a preset parameter to obtain a mirror current corresponding to the supply voltage. The preset parameter is parameter information of the mirror current source.

The current-to-voltage converter is configured to convert the mirror current into a voltage, to provide a bias voltage based on the voltage.

An embodiment of the present disclosure provides an amplifier, which includes a bias current fixer, a first amplification transistor, a second amplification transistor, and the bias circuit as described above.

An output terminal and a signal input terminal of the bias current fixer are connected to a first terminal of the first amplification transistor.

An output terminal of the bias circuit is connected to a first terminal of the second amplification transistor.

A second terminal of the first amplification transistor is connected to a second terminal of the second amplification transistor.

A third terminal of the second amplification transistor is connected to a supply voltage terminal and a signal output terminal.

The bias current fixer is configured to fix a current in the first amplification transistor.

The bias circuit is configured to supply a bias voltage to the second amplification transistor.

The first amplification transistor is configured to amplify an input signal acquired from the signal input terminal to obtain an amplified signal, and transmit the amplified signal to the second terminal of the second amplification transistor.

The second amplification transistor is configured to amplify the amplified signal to obtain an output signal, and output the output signal through the signal output terminal.

Various embodiments of the present disclosure provide a bias circuit and an amplifier. The bias circuit includes a mirror current source and a current-to-voltage converter. The first terminal of the mirror current source is connected to a supply voltage terminal, the second terminal of the mirror current source is connected to a reference voltage terminal, and the third terminal of the mirror current source is connected to a current-to-voltage converter. The mirror current source is configured to acquire a supply voltage transmitted at the supply voltage terminal through the first terminal, acquire a reference voltage transmitted at the reference voltage terminal through the second terminal, and regulate the supply voltage by using the reference voltage and a preset parameter to obtain a mirror current corresponding to the supply voltage. The preset parameter is parameter information of the mirror current source. The current-to-voltage converter is configured to convert the mirror current into a voltage to provide a bias voltage based on the voltage. With the implementation of the bias circuit described above, the mirror current source is connected to the supply voltage terminal, the reference voltage terminal and the current-to-voltage converter, to regulate the supply voltage according to the reference voltage and the preset parameter to obtain the mirror current corresponding to the supply voltage, and the current-to-voltage converter converts the mirror current into the voltage, so that the bias circuit can provide the bias voltage based on the voltage. Since the reference voltage and the preset parameter are constant values, the bias voltage provided may increase as the supply voltage increases, and the bias voltage provided may decrease as the supply voltage decreases, thereby improving the accuracy of the provided bias voltage.

DETAILED DESCRIPTION

In order to understand the features and technical content of the embodiments of the present disclosure in more detail, the implementation of the embodiments of the present disclosure are described in detail below with reference to the accompanying drawings, which are intended only for illustration rather than limiting the embodiments of the present disclosure.

In some implementations, when the power supply voltage of the amplifier is set, a bias circuit may be used to provide a bias voltage to a transistor in the amplifier, such that the output power of the amplifier has a good linearity performance at the supply voltage. However, according to the Third-Generation Partnership Project (3GPP) protocol, in addition to the conventional supply voltage of 3.5 V, the amplifier also needs to operate at a supply voltage of low-voltage 3 V and high-voltage 4.6 V. In this case, the bias voltage provided by the bias circuit cannot meet the needs of the bias performance of the transistor in the amplifier, which reduces accuracy of the provided bias voltage.

Figure 1:
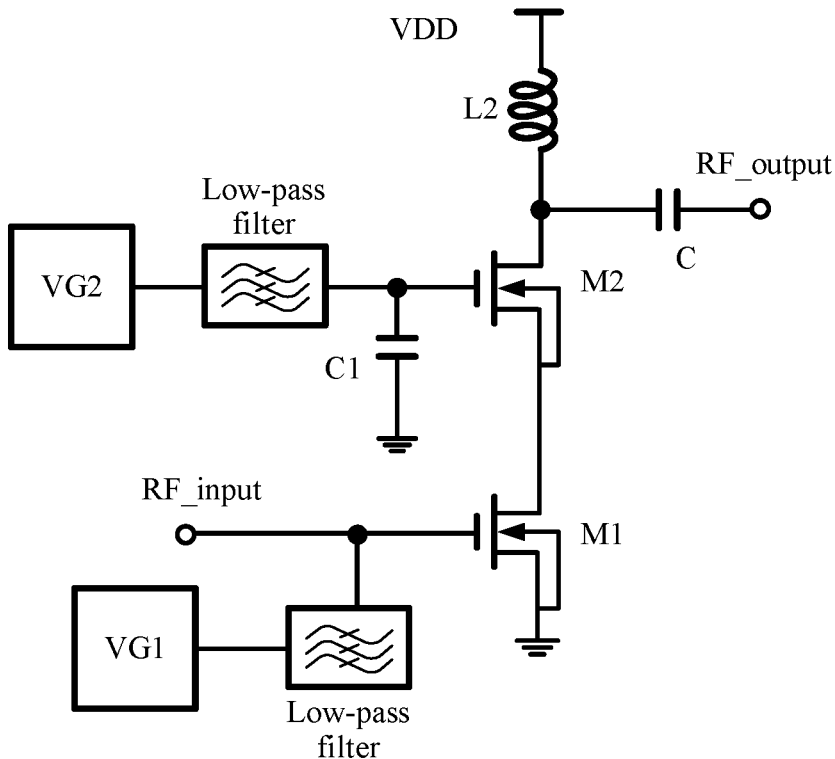
FIG. 1 is a schematic diagram of an amplifier in some implementations according to some embodiments of the present disclosure.

In a case where the power amplifier operates in 4G LTE/5G NR, a power gain of the amplifier should be kept unchanged as possible when the input power increases gradually, so that the gain is a constant value. However, the gain of the amplifier cannot always be a constant value in practice. The gain of the amplifier gradually decreases as the input power of the amplifier continuously increases. In the case where the gain of the amplifier varies small, the output power linearly changes with the increase or decrease of the input power. Therefore, the amplifier has good linearity. In a power amplifier circuit made of metal-oxide semiconductor field effect transistors (MOSFETs), a cascode structure is generally used because of the requirement of withstand voltage. As shown in FIG. 1, the structure is generally composed of transistors M1 and M2, a feedback capacitor C1, a radio frequency inductor L2, a bias circuit (VG1), a bias circuit (VG2), a low-pass filter and an input terminal RF_Input and an output terminal RF_Output.

It should be noted that the amplifier has a linear dynamic range in which the output power of the amplifier increases linearly with the input power. As the input power continues increasing, the amplifier enters a non-linear region, and the output power of the amplifier no longer increases linearly with the increase of the input power. That is, the output power of the amplifier is lower than a value expected based on the small signal gain. The output power value at which the gain is reduced to 1 dB smaller than the linear gain is usually defined as a 1 dB compression point of the output power, which is denoted as P1 dB, i.e., compressed output power per one decibel (P1 dB).

It should be noted that the linearity of the power amplifier mainly refers to the gain linearity, that is, the output power (P1 dB) of the power amplifier when the output power of the power amplifier reaches the 1 dB compression point.

It should also be noted that with other indicators remain unchanged, the performance gets better with increase of the P1 dB.

In some implementations of a cascode-structure power amplifier, the bias circuit VG1 can provide a fixed bias voltage to a gate of the transistor M1 and the bias circuit VG2 can provide a fixed bias voltage to a gate of the transistor M2, for a given power voltage VDD. In this way, the output power of the power amplifier has a good linearity performance at the VDD voltage. However, in addition to the conventional supply voltage VDD of 3.5 V, the power amplifier also operates at a supply voltage VDD of low-voltage 3 V and high-voltage 4.6 V according to the 3GPP protocol.

When the supply voltage VDD is a low voltage, since VG1 and VG2 are constant, a bias current of the amplifier is almost constant, and a gate-source voltage VGS of the transistor M2 changes very little. Therefore, a reduced voltage of a source-drain voltage VDS of M2 is approximately equal to a reduced voltage of VDD. Therefore, when the input signal becomes larger, the transistor M2 enters the triode region in advance, which results in the output power entering the 1 dB compression point in advance, and thus reduces the gain linearity.

When the supply voltage VDD is a high voltage, since VG1 and VG2 are constant, the bias current of the amplifier is almost constant, and a source-drain voltage VDS of the transistor M1 is almost constant. Therefore, an alternating-current swing of the transistor M1 is constant. Since VDD is high, the input signal RF_Input of the amplifier becomes large. In this case, the transistor M1 saturates early, which results in a limited improvement in the 1 dB compression point of the output power.

Figure 2:
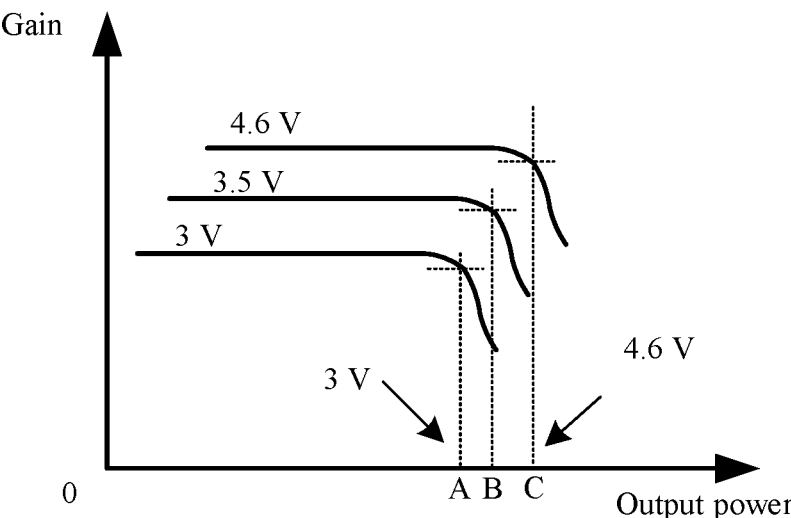
FIG. 2 is a schematic diagram of an output 1 dB compression point corresponding to an exemplary conventional power amplifier at different supply voltages according to some embodiments of the present disclosure.

For conventional power amplifiers having fixed VG1 and VG2, the output power at the 1 dB compression point is shown in FIG. 2 at a normal voltage of 3.5V, a high voltage of 4.6V and a low voltage of 3V. The output power of the 1 dB compression point is a power at position B in a case that a supply voltage is 3.5V, and the output power of the 1 dB compression point is a power at position A in a case that a supply voltage is 3 V, which is smaller than the power at position B. In a case that a supply voltage is 4.6 V, the output power of the 1 dB compression point is the power at position C, which is larger than the power at position B.

The problems in some implementations can be solved by the following embodiments.

First Embodiment

Figure 3:
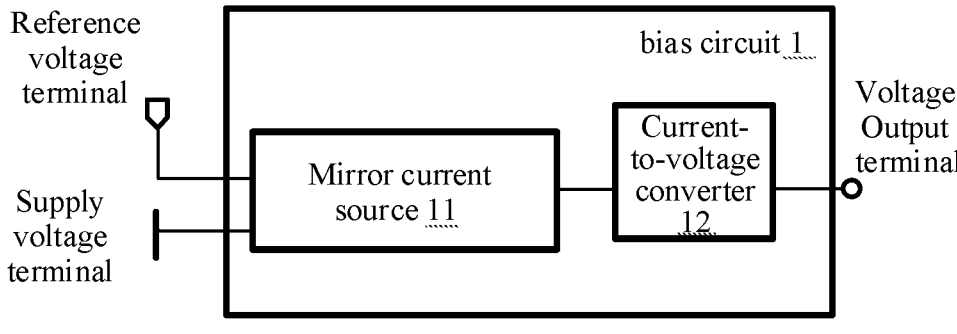
FIG. 3 is a schematic structural composition diagram of a bias circuit according to some embodiments of the present disclosure.

An embodiment of the present disclosure provides a bias circuit 1. As shown in FIG. 3, the bias circuit 1 includes a mirror current source 11 and a current-to-voltage converter 12.

A first terminal of the mirror current source 11 is connected to a supply voltage terminal.

A second terminal of the mirror current source 11 is connected to a reference voltage terminal.

A third terminal of the mirror current source 11 is connected to the current-to-voltage converter 12.

The mirror current source 11 is configured to acquire a supply voltage transmitted from the supply voltage terminal through the first terminal, acquire a reference voltage transmitted from the reference voltage terminal through the second terminal, and regulate the supply voltage using the reference voltage and a preset parameter to obtain a mirror current corresponding to the supply voltage. The preset parameter is parameter information of the mirror current source.

The current-to-voltage converter 12 is configured to convert the mirror current into a voltage to provide a bias voltage based on the voltage.

The bias circuit provided by the embodiment of the present disclosure is applied to a scenario in which a bias voltage is generated.

In the embodiment of the present disclosure, the power supply voltage terminal is configured to provide the power supply voltage for the bias circuit. The power supply voltage may be 3.5V, 3V, or 4.6V. Specifically, the power supply voltage may be determined according to an actual situation, which is not limited in the embodiment of the present disclosure.

In the embodiment of the present disclosure, the reference voltage terminal is configured to provide a reference voltage to the bias circuit. The reference voltage may be 3.5V, or may be another value. Specifically, the reference voltage may be determined according to an actual situation, which is not limited in the embodiment of the present disclosure.

In the embodiment of the present disclosure, the current-to-voltage converter may be a digital-to-analog converter (DAC), or may be another converter that converts a current into a voltage. Specifically, the current-to-voltage converter may be determined according to an actual situation, which is not limited in the embodiment of the present disclosure.

It should be noted that the preset parameter is the parameter information of the mirror current source.

In the embodiment of the present disclosure, the mirror current source can be a current source formed by a transistor, a current source formed by a triode, or a current source formed by other device. Specifically, the mirror current source can be determined according to an actual situation, which is not limited in the embodiment of the present disclosure.

It should be noted that the transistor is a metal-oxide semiconductor field effect transistor (MOSFET), the transistor can be a complementary metal-oxide semiconductor (C-MOS) transistor or a P-MOS transistor. The transistor may be determined according to an actual situation, which is not limited in this embodiment of this application.

In the embodiment of the present disclosure, in the case where the bias circuit is applied to the amplifier to supply the bias voltage to the transistor in the amplifier, the supply voltage terminal in the bias circuit and the supply voltage terminal in the amplifier are the same supply voltage terminal.

Figure 4:
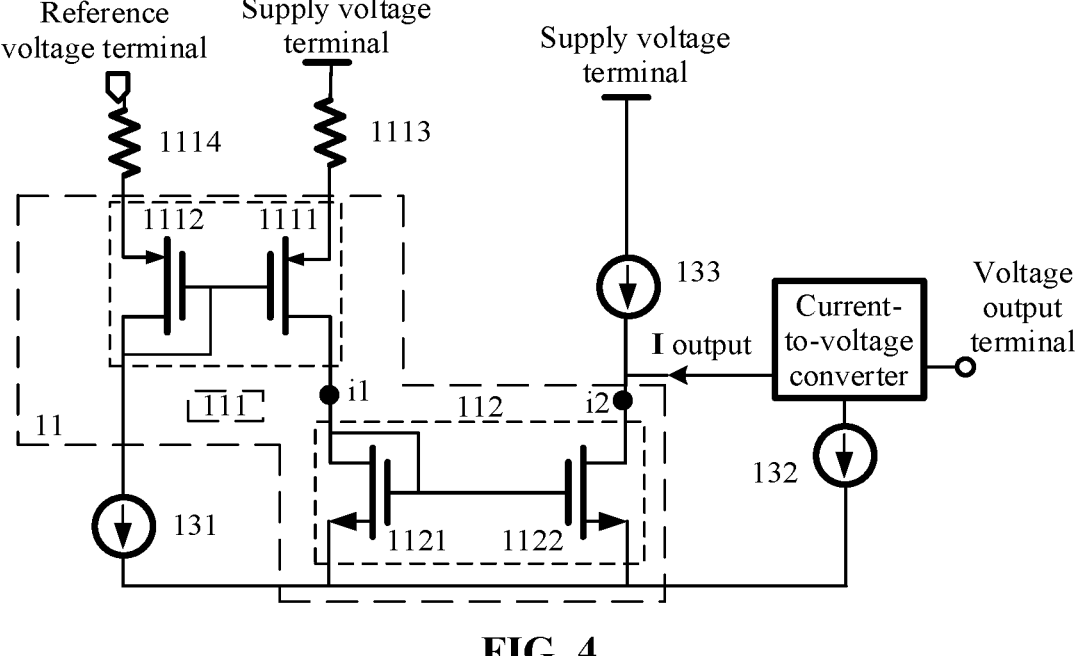
FIG. 4 is a schematic structural composition diagram of an exemplary bias circuit according to some embodiments of the present disclosure.

In some embodiments, as shown in FIG. 4, the mirror current source includes a first mirror current source 111 and a second mirror current source 112.

A first input terminal of the first mirror current source 111 is connected to the supply voltage terminal.

A second input terminal of the first mirror current source 111 is connected to the reference voltage terminal.

An output terminal of the first mirror current source 111 is connected to an input terminal of the second mirror current source 112.

An output terminal of the second mirror current source 112 is connected to the current-to-voltage converter 12.

The first mirror current source 111 is configured to regulate the supply voltage using the reference voltage and the first parameter to generate the first mirror current. The first parameter is parameter information of the first mirror current source, and is a part of the preset parameter.

The second mirror current source 112 is configured to obtain a second mirror current positively correlated with the first mirror current according to the first mirror current and a positive correlation coefficient. The positive correlation coefficient is a coefficient obtained according to a parameter of the second mirror current source. The parameter of the second mirror current source is a parameter other than the first parameter of the preset parameter.

It should be noted that the current i1 in FIG. 4 is the first mirror current.

In the embodiment of the present disclosure, a positive correlation current (current i2 in FIG. 4) can be obtained according to the first mirror current (i1) and the positive correlation coefficient, and then the second mirror current (current $I_{output}$ in FIG. 4) can be obtained according to the positive correlation current and a current in the third fixed current source 133.

In some embodiments, as shown in FIG. 4, the first mirror current source 111 includes a first transistor 1111, and the second mirror current source 112 includes a second transistor 1121.

A first drain of the first transistor 1111 is connected to a second drain of the second transistor 1121.

The second transistor 1121 is configured to obtain the first mirror current from the first drain.

In some embodiments, as shown in FIG. 4, the first mirror current source 111 of the bias circuit 1 further includes a third transistor 1112.

A gate of the first transistor 1111 is connected to a gate of the third transistor 1112.

A source of the first transistor 1111 is connected to the supply voltage terminal through a first pull-up resistor 1113.

A source of the third transistor 1112 is connected to the reference voltage terminal through a second pull-up resistor 1114.

A drain of the third transistor 1112 is connected to the gate of the third transistor 1112.

The source of the first transistor 1111 is configured to obtain a supply voltage from the supply voltage terminal through the first pull-up resistor 1113.

The source of the third transistor 1112 is configured to obtain a reference voltage from the reference voltage terminal through the second pull-up resistor 1114.

The first mirror current source 111 is configured to regulate the supply voltage using the reference voltage, the first parameter, the first pull-up resistor 1113 and the second pull-up resistor 1114, to obtain the first mirror current.

In some embodiments, as shown in FIG. 4, the second mirror current source 112 further includes a fourth transistor 1122.

A gate of the second transistor 1121 is connected to a gate of the fourth transistor 1122.

The gate of the second transistor 1121 is connected to the second drain of the second transistor 1121.

A source of the second transistor 1121 is connected to a source of the fourth transistor 1122.

The second mirror current source 112 is configured to regulate the first mirror current using the positive correlation coefficient to obtain the second mirror current.

In the embodiment of the present disclosure, the positive correlation current (i2) can be obtained according to a product of the first mirror current and the positive correlation coefficient, and then the second mirror current ($I_{output}$) can be obtained according to a difference between the positive correlation current and a current in a third fixed current source 133.

In some embodiments, as shown in FIG. 4, the bias circuit 1 further includes a fixed current source 13. The fixed current source 13 includes a first fixed current source 131, a second fixed current source 132 and a third fixed current source 133.

A drain of the third transistor 1112 is connected to the source of the second transistor 1121 through the first fixed current source 131.

A source of the fourth transistor 1122 is connected to a second terminal of the current-to-voltage converter through the second fixed current source 132.

The supply voltage terminal is connected to a first terminal of the current-to-voltage converter 12 and a drain of the fourth transistor 1122 through the third fixed current source 133.

In some embodiments, as shown in FIG. 4, the first transistor 1111 and the third transistor 1112 are identical transistors, and the second transistor 1121 and the fourth transistor 1122 are identical transistors.

In the embodiment of the present disclosure, both the first transistor and the third transistor may be C-MOS transistors or P-MOS transistors. Specifically, the first transistor and the third transistor may be determined according to an actual situation, which is not limited in the embodiment of the present disclosure.

In the embodiment of the present disclosure, both the second transistor and the fourth transistor may be C-MOS transistors, or P-MOS transistors. Specifically, the second transistor and the fourth transistor may be determined according to an actual situation, which is not limited in the embodiment of the present disclosure.

In some embodiments, the current-to-voltage converter 12 includes a digital-to-analog converter.

It should be noted that the digital-to-analog converter is a DAC converter.

In the embodiment of the present disclosure, FIG. 4 is a simplified diagram of the bias circuit. In a case where the reference voltage in FIG. 4 is 3.5 V, the voltage output terminal can output an accurate bias voltage when the supply voltage is 3.5V. The current i1 increases as the supply voltage increases, and a current flowing through the transistor 1121 increases, so that the gate-source voltage VGS of the transistor 1121 increases. Because the gate-source voltages of the transistors 1121 and 1122 are equal, the current i2 flowing through the transistor 1122 increases. Since the current i2 is the sum of $I_{output}$ and the fixed current 133, as $I_{output}$ increases, the increased amount of $I_{output}$ may be converted from the current (I) to the voltage (V) through the current-to-voltage converter, so that a voltage at the voltage output terminal increases. In a case where the supply voltage decreases, i1 decreases and i2 flowing through the transistor 1122 also decreases. Since the fixed current 133 remains unchanged, $I_{output}$ decreases, and the voltage converted by the current-to-voltage converter and outputted through the output terminal decreases.

Figure 5A:
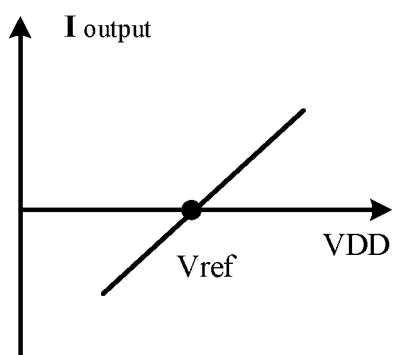
FIG. 5A is a schematic diagram of an exemplary relationship between a second mirror current and a supply voltage according to some embodiments of the present disclosure.
Figure 5B:
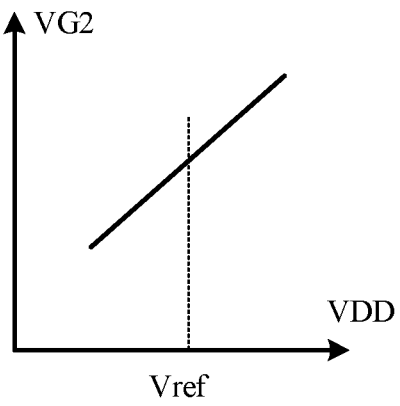
FIG. 5B is a schematic diagram of an exemplary relationship between a voltage output from a voltage output terminal and a supply voltage according to some embodiments of the present disclosure.

In the embodiment of the present disclosure, a change tendency of the second mirror current ($I_{output}$) and a change tendency of the voltage (VG2) outputted from the voltage output terminal with the change of the supply voltage (VDD) are shown in FIGS. 5A and 5B. In FIG. 5A, there is a linear correlation between VDD and $I_{output}$. $I_{output}$ decreases as VDD decreases, $I_{output}$ increases as VDD increase, and $I_{output}$ is 0 when VDD is equal to the reference voltage (Vref). In FIG. 5B, there is also a linear correlation between VDD and VG2, VG2 decreases as VDD decrease, and VG2 increases as VDD increase.

In the embodiment of the present disclosure, the positive correlation current i2 is equal to the sum of the current in the third fixed current source 133 and the second mirror current ($I_{output}$). Since the current in the third fixed current source 133 is constant, a change amount of the positive correlation current (i2) is equal to a change amount of the second mirror current ($I_{output}$).

In the embodiment of the present disclosure, the first mirror current (i1) is the same as the positive correlation current (i2), and a change amount of the first mirror current (i1) is the same as a change amount of the positive correlation current (i2). The change amount of the first mirror current (i1) is about a value obtained by dividing a difference between the supply voltage and the reference voltage by a resistance value of a resistance at 1113, and the change amount of the second mirror current ($I_{output}$) and the variation of the positive correlation current (i2) are also a value obtained by dividing a difference between the supply voltage and the reference voltage by the resistance value of a resistance at 1113, that is, the linear correlation exists between the $I_{output}$ and VDD.

In the embodiment of the present disclosure, the current-to-voltage converter can convert the second mirror current into a voltage according to a conversion coefficient. The conversion coefficient is constant, and the linear correlation exists between VDD and VG2.

It can be understood that the mirror current source is connected to the supply voltage terminal, the reference voltage terminal and the current-to-voltage converter, to regulate the supply voltage according to the reference voltage and the preset parameter, so as to obtain the mirror current corresponding to the supply voltage, and the current-to-voltage converter converts the mirror current into the voltage, so that the bias circuit can provide a bias voltage based on the voltage. Since the reference voltage and the preset parameter are constant, the bias voltage provided may increase with the increase of the supply voltage, and decrease with the decrease of the supply voltage, thereby improving the accuracy of the provided bias voltage.

Second Embodiment

Figure 6:
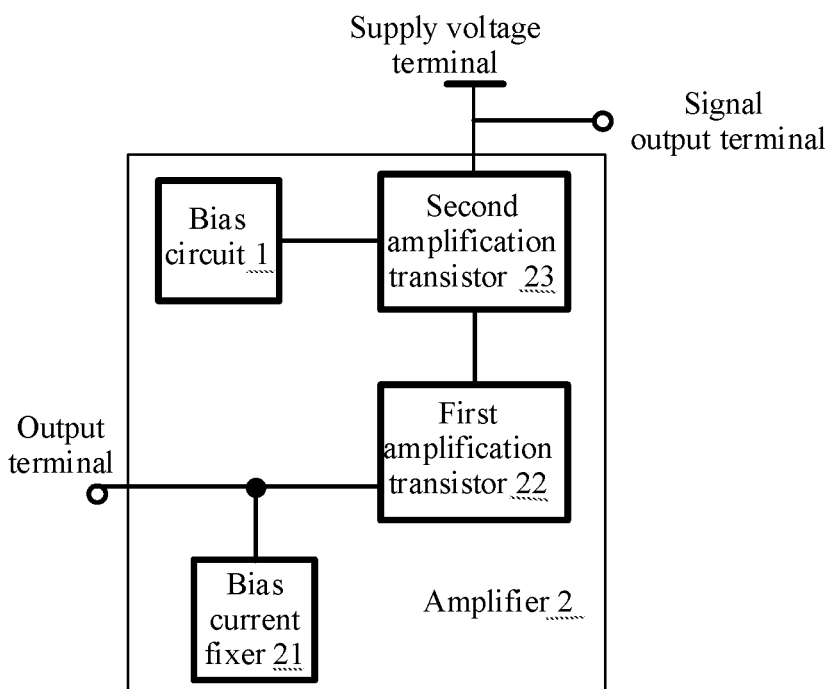
FIG. 6 is a schematic structural composition diagram of an exemplary amplifier according to some embodiments of the present disclosure.

Another embodiment of the present disclosure provides an amplifier. As shown in FIG. 6, the amplifier 2 includes a bias current fixer 21, a first amplification transistor 22, a second amplification transistor 23, and the bias circuit 1 according to the first embodiment of the present disclosure.

An output terminal of the bias current fixer 21 and a signal input terminal are connected to a first terminal of the first amplification transistor 22.

An output terminal of the bias circuit 1 is connected to a first terminal of the second amplification transistor 23.

A second terminal of the first amplification transistor 22 is connected to a second terminal of the second amplification transistor 23.

A third terminal of the second amplification transistor 23 is connected to a supply voltage terminal and a signal output terminal.

The bias current fixer 21 is configured to fix a current in the first amplification transistor 22.

The bias circuit 1 is configured to supply a bias voltage to the second amplification transistor 23.

The first amplification transistor 22 is configured to amplify an input signal acquired from the signal input terminal to obtain an amplified signal, and transmit the amplified signal to the second terminal of the second amplification transistor 23.

The second amplification transistor 23 is configured to amplify the amplified signal to obtain an output signal, and output the output signal through the signal output terminal.

The amplifier provided by the embodiment of the present disclosure is applied to a scenario in which a bias voltage is provided using a bias circuit.

In the embodiment of the present disclosure, the amplifier further includes a low-pass filter, an inductor, a capacitor and the like, which can be specifically determined according to an actual situation, and is not limited in the embodiment of the present disclosure.

In the embodiment of the present disclosure, the number of the first amplification transistors and the second amplification transistors in the amplifier can be determined according to actual conditions, which is not limited in the embodiment of the present disclosure.

In the embodiment of the present disclosure, the number of low-pass filters in the amplifier is the same as the total number of the first amplification transistors and second amplification transistors.

Figure 7:
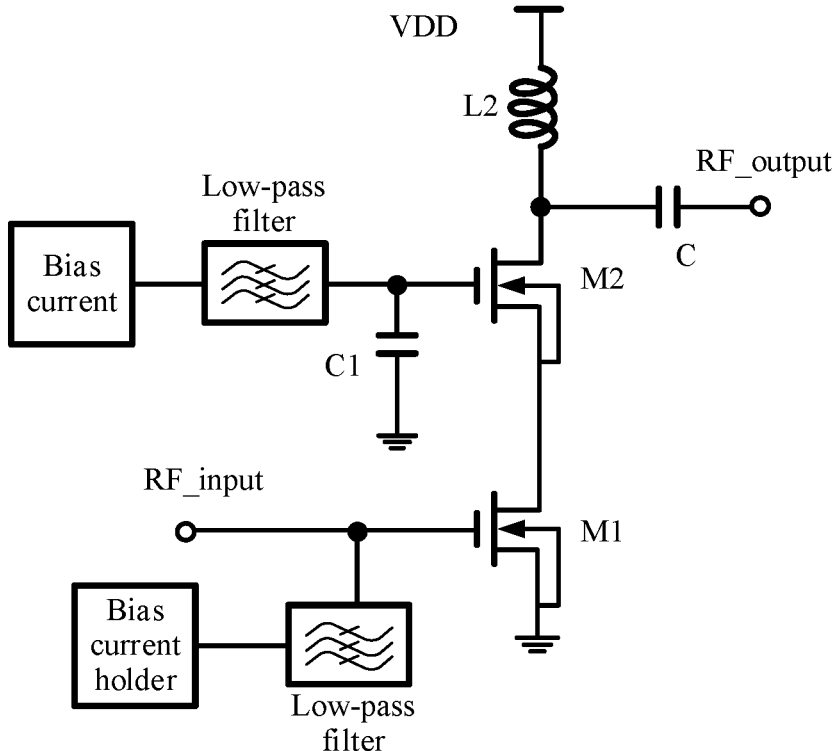
FIG. 7 is a schematic structural composition diagram of an amplifier according to some embodiments of the present disclosure.

For example, as shown in FIG. 7, VDD provides a power supply voltage to the amplifier through an inductance L2, M1 and M2 are transistors, and RF_Input is an input terminal of the amplifier. After the amplifier amplifies the input signal, the amplifier transmits, through the capacitor C, the amplified input signal to the RF_Output terminal for outputting. The bias voltage outputted from the bias current fixer (VG1 bias circuit) is filtered by the low-pass filter and is then transmitted to the transistor M1 (first amplification transistor) to provide a bias voltage for the transistor M1. The bias voltage outputted from the bias circuit (bias circuit VG2) is filtered by the low-pass filter and is then transmitted to the transistor M2 (second amplification transistor) through the capacitance C1, to provide a bias voltage to the transistor M2. The bias voltage provided by the bias circuit may change with the change of VDD, to provide a suitable bias voltage for the cascaded transistors when the VDD changes.

In some embodiments, the amplifier 2 comprises an amplifier of a cascode amplifier and/or an amplifier in a cascade structure of multi-stage transistors.

In the embodiment of the present disclosure, the amplifier may be a cascode amplifier, or the amplifier may be an amplifier in a cascade structure of multi-stage transistors, or the amplifier may be an amplifier circuit formed by triodes, which may be determined according to an actual situation.

Figure 8:
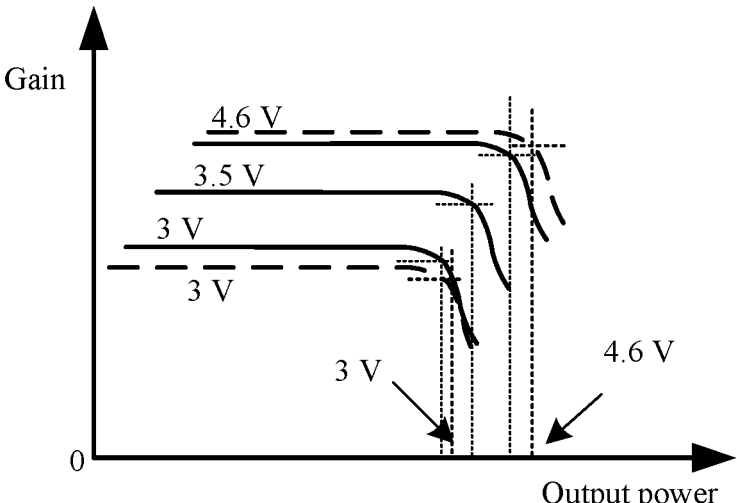
FIG. 8 is a schematic diagram of an exemplary relationship among a supply voltage, a reference voltage and a voltage according to some embodiments of the present disclosure.

Exemplarily, the linearity of the amplifier is significantly improved and the 1 dB compression point of the output power is improved after the bias circuit of the first embodiment is used in the amplifier by several tests. As shown by a dashed line in FIG. 8, after the above bias circuit is used, an output power of the amplifier including the bias circuit increases at the 1 dB compression point compared with some implementations when the power supply voltage VDD of the amplifier is 3V. When the supply voltage VDD of the amplifier is 4.6V, the output power of the amplifier including the bias circuit also increases at the 1 dB compression point compared with some implementations. The increased amplitude when VDD is 4.6V is greater than that when VDD is 3V. Therefore, the output power of the amplifier in the present disclosure increases at the 1 dB compression point compared with some implementations.

Figure 9:
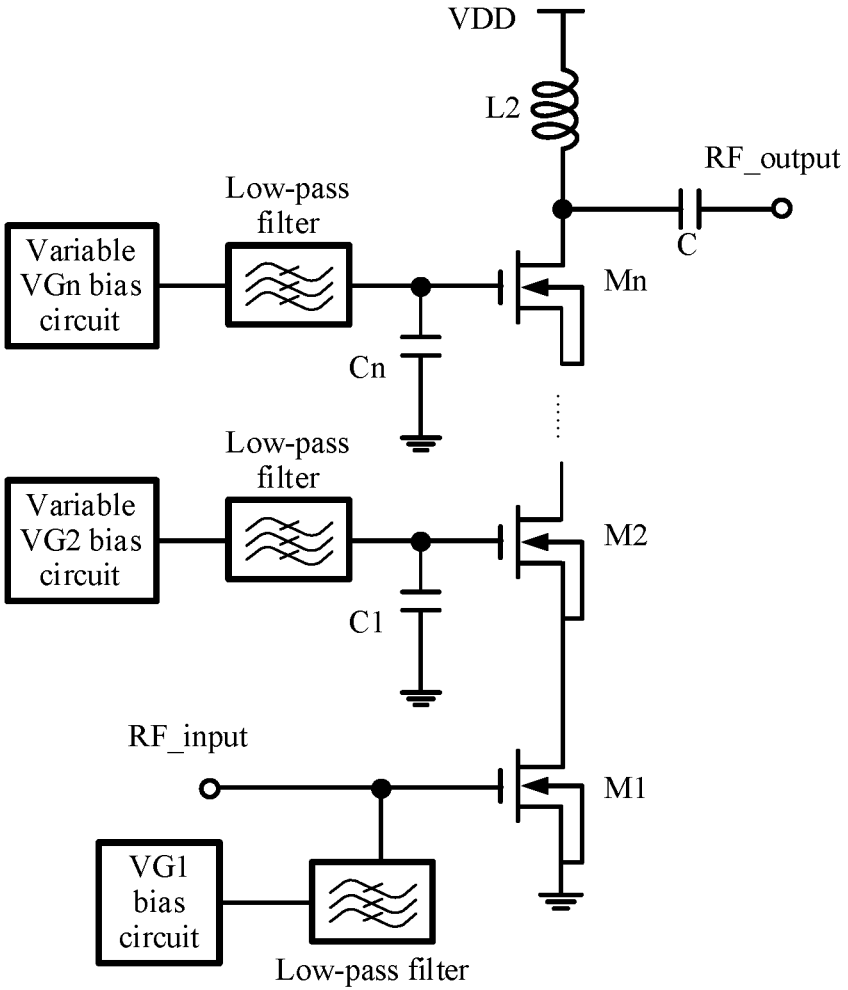
FIG. 9 is a schematic structural diagram of an exemplary amplifier according to some embodiments of the present disclosure.

In the embodiment of the present disclosure, if the amplifier is an amplifier in a cascade structure of multi-stage transistors, a circuit structure of the amplifier is shown in FIG. 9. VDD supplies a supply voltage to the amplifier through an inductor L2. M1, M2, . . . Mn are cascaded transistors, the RF_Input is an input terminal of the amplifier, the amplifier amplifies an input signal and then transmits, through the capacitance C, the amplified signal to the RF_Output terminal for outputting. A bias voltage outputted from the bias current fixed (VG1 bias circuit) is filtered by a low-pass filter and then transmitted to the transistor M1 to provide the bias voltage to the transistor M1. A bias voltage outputted from the VG2 bias circuit is filtered by a low-pass filter and then transmitted, through the capacitance C1, to the transistor M2 to supply the bias voltage to the M2 transistor, and so forth. A bias voltage outputted from the VGn bias circuit is filtered by a low-pass filter and then transmitted, through the capacitance Cn, to the transistor Mn, to provide the bias voltage for the transistor Mn. The VG2 bias circuit to the VGn bias circuit are the bias circuits provided in the first embodiment of the present disclosure, and the bias voltages provided by the bias circuits may vary with the change of VDD, to provide a suitable bias voltage for the cascaded transistors when VDD changes.

In some embodiments of the present disclosure, compared with a circuit configuration having the fixed bias of VG2 in some implementations, the amplifier of the present disclosure can not only ensure the linearity of the output power at the normal supply voltage (35 V), but also effectively improve the linearity of the output power of the power amplifier when the supply voltage is increased or decreased. The bias circuit can be used not only in the power amplifier of the cascode structure but also in the power amplifier (the amplifier as shown in FIG. 9) of the multistage transistor stack structure, and the bias circuit can effectively improve the output linearity of the power amplifier.

It should be understood that, by connecting the output terminal of the bias circuit to the first terminal of the second amplification transistor and connecting the third terminal of the second amplification transistor to the supply voltage terminal, the bias circuit can provide accurate bias voltage for the second amplification transistor according to the changed supply voltage under a condition that the power supply voltage changes, thus improving the linearity of the amplifier.

Those skilled in the art will appreciate that embodiments of the present disclosure may be provided as methods, systems, or computer program products. Accordingly, the present disclosure may take the form of a hardware embodiment, a software embodiment, or an embodiment combining software and hardware. Further, the present disclosure may take the form of a computer program product implemented on one or more computer-usable storage media (including but not limited to, magnetic disk storage, optical storage, and the like) in which computer-usable program code is contained.

The present disclosure is described with reference to flowcharts and/or block diagrams of methods, devices (systems), and computer program products according to embodiments of the present disclosure. It will be appreciated that each flow and/or block in the flowchart and/or block diagram and the combination of the flow and/or block in the flowchart and/or block diagram may be implemented by computer program instructions. These computer program instructions can be provided to a processor of a general purpose computer, a dedicated computer, an embedded processor, or other programmable data processing device to generate a machine such that instructions executed by the processor of the computer or other programmable data processing device to generate a device, which is used to implement the functions specified in one or more of the flowcharts and/or one or more of the block diagrams.

The computer program instructions may also be stored in a computer-readable memory capable of directing a computer or other programmable data processing device to operate in a particular manner, such that the instructions stored in the computer-readable memory produce manufactured articles including instructions that implement the functions specified in one or more of the flowcharts and/or in one or more of the block diagrams.

The computer program instructions may also be loaded onto a computer or other programmable data processing device such that a series of operational steps are performed on the computer or other programmable device to generate computer-implemented processing. Thus, instructions executed on a computer or other programmable device provide steps for implementing the functions specified in one or more processes of the flowchart and/or one or more blocks of the block diagram.

The embodiments of the present disclosure provide a bias circuit and an amplifier, the bias circuit including a mirror current source and a current-to-voltage converter. A first terminal of the mirror current source is connected to a supply voltage terminal, a second terminal of the mirror current source is connected to a reference voltage terminal, and a third terminal of the mirror current source is connected to a current-to-voltage converter. A mirror current source configured to acquire a supply voltage transmitted at a supply voltage terminal through the first terminal, acquire a reference voltage transmitted at a reference voltage terminal through the second terminal, and regulate the supply voltage by using the reference voltage and a preset parameter to obtain a mirror current corresponding to the supply voltage. The preset parameter is parameter information of the mirror current source. The current-to-voltage converter configured to convert the mirror current into a voltage to provide a bias voltage based on the voltage. In the implementation of the bias circuit, the mirror current source is connected to the supply voltage terminal, the reference voltage terminal, and the current-to-voltage converter, to regulate the supply voltage according to the reference voltage and the preset parameter to obtain the mirror current corresponding to the supply voltage, and the current-to-voltage converter converts the mirror current into the voltage, so that the bias circuit can provide the bias voltage based on the voltage. Since the reference voltage and the preset parameter are constant values, the bias voltage provided can be increased with the increase of the supply voltage, and the bias voltage provided can be decreased with the decrease of the supply voltage, thereby improving the accuracy of the provided bias voltage.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A bias circuit, comprising:
a mirror current source and a current-to-voltage converter; wherein
a first terminal of the mirror current source is connected to a supply voltage terminal;
a second terminal of the mirror current source is connected to a reference voltage terminal outside the bias circuit;
a third terminal of the mirror current source is connected to the current-to-voltage converter;

the mirror current source is configured to acquire, through the first terminal, a supply voltage, which is variable, transmitted by the supply voltage terminal, acquire, through the second terminal, a reference voltage transmitted by the reference voltage terminal, and regulate the supply voltage by using the reference voltage and a preset parameter to obtain a mirror current corresponding to the supply voltage, the preset parameter is parameter information of the mirror current source, and
the current-to-voltage converter is configured to convert the mirror current into a voltage to provide a bias voltage at a voltage output terminal based on the voltage substantially linearly with the supply voltage.

2. The bias circuit of claim 1, wherein
the mirror current source comprises a first mirror current source and a second mirror current source;
a first input terminal of the first mirror current source is connected to the supply voltage terminal;
a second input terminal of the first mirror current source is connected to the reference voltage terminal;
an output terminal of the first mirror current source is connected to an input terminal of the second mirror current source;
an output terminal of the second mirror current source is connected to the current-to-voltage converter;
the first mirror current source is configured to regulate the supply voltage using the reference voltage and a first parameter to generate a first mirror current, the first parameter is parameter information of the first mirror current source, and is a part of the preset parameter, and
the second mirror current source is configured to obtain a second mirror current positively correlated with the first mirror current according to the first mirror current and a positive correlation coefficient, the positive correlation coefficient is a coefficient obtained according to a parameter of the second mirror current source, the parameter of the second mirror current source is a parameter other than the first parameter among the preset parameters.

3. The bias circuit of claim 2, wherein
the first mirror current source comprises a first transistor, and the second mirror current source comprises a second transistor;
a first drain of the first transistor is connected to a second drain of the second transistor, and
the second transistor is configured to obtain the first mirror current from the first drain.

4. The bias circuit of claim 3, wherein
the first mirror current source further comprises a third transistor;
a gate of the first transistor is connected to a gate of the third transistor;
a source of the first transistor is connected to the reference voltage terminal through a first pull-up resistor;
a source of the third transistor is connected to the supply voltage terminal through a second pull-up resistor;
a drain of the third transistor is connected to a gate of the third transistor;
a source of the first transistor is configured to obtain a supply voltage from the supply voltage terminal through the first pull-up resistor;
a source of the third transistor is configured to obtain a reference voltage from the reference voltage terminal through the second pull-up resistor, and
the first mirror current source is configured to regulate the supply voltage using the reference voltage, the first parameter, the first pull-up resistor and the second pull-up resistor, to obtain the first mirror current.

5. The bias circuit of claim 3, wherein the second mirror current source further comprises a fourth transistor;

a gate of the second transistor is connected to a gate of the fourth transistor;

the gate of the second transistor is connected to the second drain of the second transistor;

a source of the second transistor is connected to a source of the fourth transistor; and the second mirror current source is configured to regulate the first mirror current using the positive correlation coefficient to obtain the second mirror current.

6. The bias circuit of claim 5, further comprising a fixed current source, wherein the fixed current source comprises a first fixed current source, a second fixed current source and a third fixed current source;

the drain of the third transistor is connected to a source of the second transistor through the first fixed current source;

a source of a fourth transistor is connected to a second terminal of the current-to-voltage converter through the second fixed current source, and the supply voltage terminal is respectively connected to a first terminal of the current-to-voltage converter and a drain of the fourth transistor through the third fixed current source.

7. The bias circuit according to claim 4, wherein the first transistor and the third transistor are identical transistors, and the second transistor and the fourth transistor are identical transistors.

8. The bias circuit of claim 1, wherein the current-to-voltage converter comprises a digital-to-analog converter.

9. An amplifier, comprising:

a bias current fixer, a first amplification transistor, a second amplification transistor, and the bias circuit according to claim 1, wherein an output terminal and a signal input terminal of the bias current fixer are connected to a first terminal of the first amplification transistor;

an output terminal of the bias circuit is connected to a first terminal of the second amplification transistor;

a second terminal of the first amplification transistor is connected to a second terminal of the second amplification transistor;

a third terminal of the second amplification transistor is connected to a supply voltage terminal and a signal output terminal;

the bias current fixer is configured to fix a current in the first amplification transistor;

the bias circuit is configured to supply a bias voltage to the second amplification transistor;

the first amplification transistor is configured to amplify an input signal acquired from a signal input terminal to obtain an amplified signal, and transmit the amplified signal to the second terminal of the second amplification transistor, and the second amplification transistor is configured to amplify the amplified signal to obtain an output signal, and output the output signal through the signal output terminal.

10. The amplifier of claim 9, wherein the amplifier comprises at least one of a cascode amplifier or an amplifier in a cascade structure of multi-stage transistors.

11. The amplifier of claim 10, wherein the reference voltage and the preset parameter are constant values, the bias voltage provided increases as the supply voltage increases, and the bias voltage provided decreases as the supply voltage decreases, thereby improving accuracy of the provided bias voltage.

12. The bias circuit of claim 1, wherein the supply voltage is variable among 3V, 3.5 V, and 4.6 V.

* * * * *